United States Patent [19]
Randall et al.

[11] Patent Number: 5,346,851
[45] Date of Patent: Sep. 13, 1994

[54] METHOD OF FABRICATING SHANNON CELL CIRCUITS

[75] Inventors: John N. Randall, Richardson; Gary A. Frazier, Garland, both of Tex.; Rajni J. Aggarwal, Somerville, Mass.

[73] Assignee: Texas Instruments Incorporated, Dallas, Tex.

[21] Appl. No.: 979,117

[22] Filed: Nov. 20, 1992

[51] Int. Cl.$^5$ .................................. H01L 21/20
[52] U.S. Cl. .............................. 437/89; 437/126; 437/105; 437/107; 437/133; 437/235; 437/228; 148/DIG. 50; 148/DIG. 51; 148/DIG. 169
[58] Field of Search ............. 437/81, 89, 105, 107, 437/126, 133, 235, 228, 90; 148/DIG. 50, DIG. 51, DIG. 169

[56] References Cited

U.S. PATENT DOCUMENTS

| | | | |
|---|---|---|---|
| 4,575,924 | 3/1986 | Reed et al. | 148/DIG. 50 |
| 4,758,870 | 7/1988 | Hase et al. | 357/34 |
| 4,783,427 | 11/1988 | Reed et al. | 437/90 |
| 4,912,531 | 3/1990 | Reed et al. | 357/12 |
| 5,234,848 | 8/1993 | Seabaugh | 437/126 |

FOREIGN PATENT DOCUMENTS 0226383  2/1986  European Pat. Off.

OTHER PUBLICATIONS

Broekaert et al., "Extremely High Current Density, Low Peak Voltage, seudomorphic In$_{0.53}$Ga$_{0.47}$As/AlAs/InAs Resonant Tunneling diodes", *IEEE 1989, IEDM 89-559*, pp. 21.5.1–21.5.4.

Broekaert et al., "AlAs Etch-Stop Layers for InGaAlAs/InP Heterostructure Devices and Circuits", *IEEE 1990, IEDM 90-339*, pp. 13.5.1–13.5.4.

Broekaert et al., "Pseudomorphic In$_{0.53}$Ga$_{0.47}$As/AlAs/InAs Resonant Tunneling Diodes With Peak-to-Valley Current Ratios of 30 at room temperature", *Appl. Phys. Lett.* 53(16), Oct. 17, 1988 pp. 1545–1547.

Stephen Y. Chou et al., "Lateral Resonant Tunneling Transistors Employing Field-Induced Quantum Wells and Barriers", *Proceedings of the IEEE*, vol. 79, No. 8 Aug. 1991 pp. 1131–1139.

Ide et al., "Sidewall Growth of Atomic Layer Epitaxy", *Appl. Phys. Lett.* 53 (23), Dec. 5, 1988 pp. 2314–2316.

Alan A. Seabaugh et al., "Pseudomorphic Bipolar Quantum Resonant-Tunneling Transistor", *IEEE Transactions on Electron Devices*, vol. 36, No. 10. 10 Oct., 1989 pp. 2328–2334.

Alan A. Seabaugh et al., "Quantum-Well Resonant-Tunneling Transistor" Paper presented at the Twelfth Biennial Conference on Advanced Concepts in High Speed Semiconductor Devices and Circuits, Aug. 7,8,9; 1989 at Cornel University.

Alan Seabaugh et al., "Room Temperature Hot Electron Transistors with InAs-Notched Resonant-Tunneling-Diode Injector", *Japanese Journal of Applied Physics*, vol. 30, No. 5, May, 1991, pp.291–925. Aug. 7,8,9, 1989, Cornell University.

(List continued on next page.)

*Primary Examiner*—R. Bruce Breneman
*Assistant Examiner*—Ramamohan Rao Paladugu
*Attorney, Agent, or Firm*—Richard A. Stoltz; Richard L. Donaldson; Rene' E. Grossman

[57] ABSTRACT

A quantum effect device implementation of the Shannon Decomposition Function in the form of a Shannon Cell is provided in which a first quantum dot logic unit (50) is coupled between the X input and the output of the Shannon Cell. A second quantum dot logic unit (52) is coupled between the Y input and the output of the Shannon Cell. The control input to the Shannon Cell is coupled to both the first and second quantum dot logic units (50 and 52) such that current flows through the appropriate quantum dot logic unit (50 or 52) depending upon the logic state of the control input.

3 Claims, 5 Drawing Sheets

OTHER PUBLICATIONS

C. J. Yang et al., "New Field-Effect Resonant Tunneling Transistor: Observation of Oscillatory Transconductance", *Appl. Phys. Lett.* 55 (26), Dec. 1989, pp. 2742–2744.

T. Yamamoto et al., "Buried Rectangular GaInAs/InP Corrugations of 70 nm Pitch Fabricated by OMVPE", *Reprint from Electronics Letters,* Jun. 21, 1990, vol. 26, No. 13, pp. 875–876.

Article by Gary A. Frazier, "Technology and Applications Roadmap for Nanelectronics", published in *The 1989 Digest of Papers, Government Microcircuit Applications Conference,* p. 219.

J. N. Randall et al., "Nanelectronics: Fanciful Physics or Real Devices?", *J. Vac. Sci. Technol.* B7 (6), Nov./Dec., 1989, pp. 1398–1404.

Federico Capasso (Ed.), "Physics of Quantum Electron Devices", *Springer–Verlag Berlin Heidelberg, New York, London, Paris, Tokyo, Hong Kong,* 1990, Chap. 7, pp. 181–252.

F. Capasso et al., "Quantum-Effect Devices", *High-Speed Semiconductor Devices,* 1990, John Wiley & Sons, Inc., pp. 465–521.

J. N. Randal et al., "Nanostructure Fabrication of Zero-Dimensional Quantum Dot Diodes", *J. Vac. Sci. Technol.* B6 (6), Nov./Dec. 1988, pp. 1861–1864.

METHOD OF FABRICATING SHANNON CELL CIRCUITS

TECHNICAL FIELD OF THE INVENTION

This invention relates generally to electronic circuits, and more particularly to circuits which provide the Shannon decomposition function, and methods of fabricating the same.

BACKGROUND OF THE INVENTION

The Shannon Decomposition Function is a Boolean function of three variables which uses a control variable, C, to select between two other inputs variables, X and Y, so as to provide the logic function (C and X) or ($\overline{C}$ and Y). This function is particularly useful in digital arithmetic because an arbitrarily complex Boolean function of N variables can be decomposed using the Shannon function into a sequence of simpler functions each of not more than three variables. Thus, a set of electronic circuits that implements the Shannon Decomposition Function can be interconnected together to implement an arbitrary combinatorial Boolean function of N Variables in the form of an electronic circuit. Since a complex logic function can be assembled solely using a regular cellular array of Shannon Decomposition Functions, the circuit that implements the Shannon Decomposition Function can be referred to appropriately as a Shannon Cell, and a suitably large regular array of Shannon Cells can implement an arbitrarily complex Boolean combinatorial function of N variables.

A Shannon Cell and arrays of Shannon Cells can be implemented using conventional electronic components such a bipolar and field effect transistors. However, the practical and physical limits upon the ability to downscale these components places a minimum constraint upon the integrated circuit area used to implement this circuitry. This is a significant drawback in light of the everpressing need to increase the functional density of integrated electronic systems.

Furthermore, with the advent of nanoelectronics, or quantum effect electronics, device geometries can be downscaled to achieve significant increases in the functional densities of integrated electronic systems. Although advances have been made in the development of quantum effect devices, the few devices which may have applications in digital circuits have significant limitations. For example, devices such as those disclosed by Chou, Allee, Pease, and Harris in "Lateral Resonant Tunneling Transistors Employing Field-Induced Quantum Wells and Barriers," Proceedings of the IEEE, Volume 79, No. 8, August 1991, pp. 1131–39, display certain characteristics of semiconductor switching devices. Through the use of an electric field, quantized regions can be created between depletion-region potential barriers, and resonant tunneling can be observed. Thus, electric current can be switched "ON" or "OFF", depending on the strength of the electric fields. The performance of such devices, however, is highly dependent upon precise dopant concentrations, and they must be operated only at low temperatures.

Therefore, a need has arisen for an implementation of the Shannon decomposition function in the form of an electronic circuit using nanoelectronic, or quantum effect, devices.

SUMMARY OF THE INVENTION

In accordance with the present invention, a quantum effect logic device implementation of a Shannon Cell is provided in which a first quantum dot logic unit is coupled between the X input for the Shannon Cell and a first stage output. Current will flow through the first quantum dot logic unit when the Shannon Cell's control input is in a first logic state. A second quantum dot logic unit is coupled between the Shannon Cell's Y input and the first stage output. Current flows through the second quantum dot logic unit when the Shannon Cell's control input is in a second logic state.

In another embodiment, a second stage buffer is coupled to the Shannon Cell described above. The buffer stage includes a first buffering quantum dot logic unit coupled between a source and an output. Current flows through the first buffering quantum dot logic unit when the first stage output is in a first logic state. A second buffering quantum dot logic unit is coupled between a sink and an output. Current flows through the second quantum dot logic unit when the first stage output is in a second logic state.

An important technical advantage of the present invention is the fact that a Shannon Decomposition function is implemented in the form of a Shannon Cell with quantum effect devices. This important technical advantage allows for implementation of a Shannon Cell in a reduced integrated circuit area.

BRIEF DESCRIPTION OF THE DRAWINGS

For a more complete understanding of the present invention and the advantages thereof, reference is now made to the following description made in conjunction with the accompanying drawings in which like references numbers indicate like features and wherein.

DETAILED DESCRIPTION OF THE INVENTION

The preferred embodiments of the present invention and its advantages are best understood by referring to FIGS. 1a–8b of the drawings, like numerals being used for like and corresponding parts of the various drawings. The illustrations in FIGS. 1a–8b are not to scale, with certain dimensions having been greatly exaggerated or diminished for clarity.

Figure 1A:
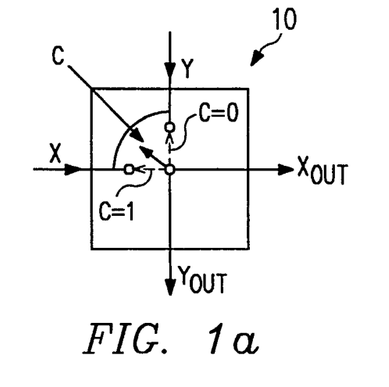
FIGS. 1a and 1b illustrate schematic diagrams of an abstract Shannon Cell.

FIG. 1a is a schematic representation of Shannon Cell and its two functional states. As shown in FIG. 1a, outputs $X_{out}$ and $Y_{out}$ are coupled together. Inputs $X_{in}$ and $Y_{in}$ are coupled to the outputs $X_{out}$ and $Y_{out}$, depending on the logic state of control input C. The Boolean logic function of a Shannon Cell is (C·X) or ($\overline{C}$·Y), where (C·X) refers to the Boolean operation C and X and "or" refers to the Boolean OR operation.

Figure 1B:
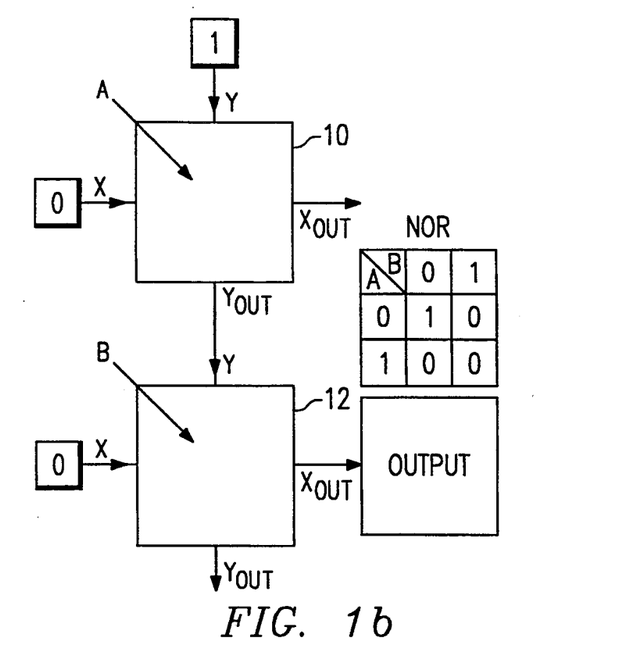

FIG. 1b illustrates how 2 Shannon Cells can be interconnected to provide the Boolean NOR operation. As shown in FIG. 1b, two Shannon Cells 10 and 12 are coupled together to form the NOR gate. In particular, the $Y_{out}$ output of Shannon Cell 10 is coupled to the Y input of Shannon Cell 12. A logic level 0 is coupled to both of the X inputs of Shannon Cells 10 and 12, and a logic 1 input is coupled to the Y input of Shannon Cell 10. The control inputs are respectively A and B for Shannon Cells 10 and 12. The output of NOR gate is taken at the $X_{out}$ output of Shannon Cell 12. With this configuration, the NOR function is realized for inputs A and B, as is shown by the truth table shown in FIG. 1b.

As discussed in the Background of the Invention, needs have arisen for a quantum effect realization of a Shannon Cell. Before discussing the particular embodiments of the present invention, a brief discussion of a quantum dot logic unit will be provided, since one embodiment of a Shannon Cell according to the present invention uses the technology of such a logic unit.

Figure 2A:
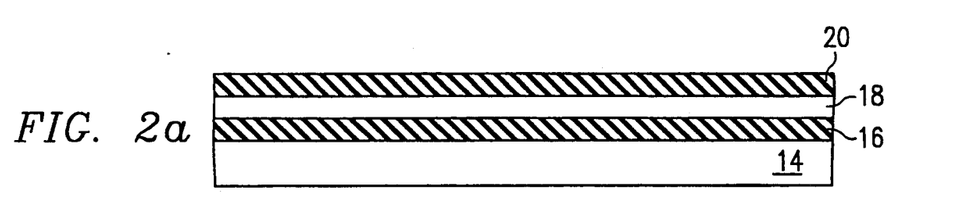
FIGS. 2a–2c illustrate epitaxial stacks forming a quantum effect digital logic element.

As shown in FIG. 2a, a substrate layer 14 is provided over which barrier layer 16, quantum layer 18, and barrier layer 20 are grown. Substrate layer 14 may comprise, for example, semi-insulating indium phosphide. Other materials, such as semi-insulating gallium arsenide may also be used. Barrier layer 16 should be formed of a semiconductor material lattice-matched to substrate layer 14. For example, barrier layer 16 may be formed of indium aluminum arsenide for a substrate of indium phosphide. Quantum layer 18 is formed of a semiconductor material having a band gap lower than that of barrier layers 16 and 20. Quantum layer 18 may be formed of, for example, indium gallium arsenide or gallium arsenide. Barrier layer 20 may be formed of, for example, indium aluminum arsenide or aluminum gallium arsenide. These layers may be grown using epitaxial crystal growth technology such as molecular beam epitaxy or organometallic chemical vapor deposition, and may be grown in a reactor such as a Riber 2300 MBE. Furthermore, a cladding layer may be formed overlying barrier layer 20 to prevent oxidation when aluminum compounds are used in barrier layer 20.

Figure 2B:
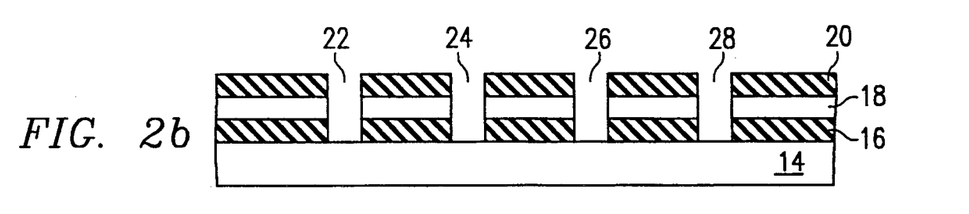

Referring now to FIG. 2b, trenches 22, 24, 26 and 28 are etched through layers 20, 18, and 16. These trenches may be formed by laying down a resist mask using electron beam lithography and then etching from the face through to substrate 14. Etches such as selective chemical etches or reactive ion etches, for example, can be used to form trenches 22 through 28.

Figure 2C:
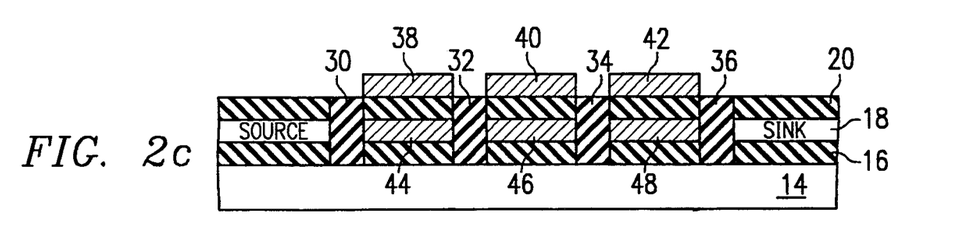

As shown in FIG. 2c, heterojunction barriers 30, 32, 34, and 36 are regrown in trenches 22 through 28. Furthermore, metallic contacts 38, 40, and 42 are formed between the trenches as shown in FIG. 2c.

In operation, potentials placed on contacts 38, 40, and 42 produce electric fields within quantum dots 44, 46, and 48 formed within quantum layer 18 between heterojunction barriers 30, 32, 34 and 36. As shown in the energy band diagram of FIG. 3, potentials placed on contacts 38, 40 and 42 can be used to adjust the level of the discreet energy states within quantum dots 44, 46, and 48. By aligning each of these discreet states to one of the potential energy states of electrons at the source, current will tunnel through the quantum dots 44, 46 and 48 to the sink illustrated in FIGS. 2c and 3. This quantum dot logic unit is described in U.S. patent application Ser. No. 07/811,557, filed Dec. 20, 1991, entitled "Universal Quantum Dot Logic unit", assigned to Texas Instruments Incorporated. That application is incorporated by reference herein.

Figure 3:
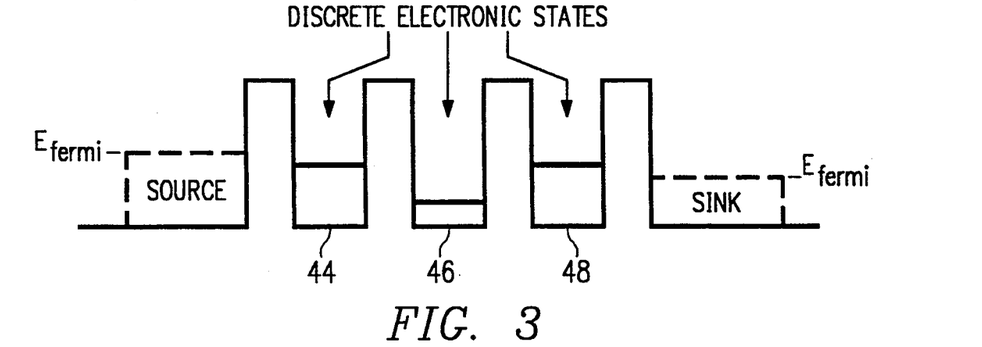
FIG. 3 is an energy band diagram of the device shown in FIGS. 2a–2c.

The particular energy state within the quantum dots of FIGS. 2a–3 are functions of the geometry or material of the dots and the electric field within the quantum dots. Alignment or misalignment of the energy states in adjoining quantum dots depends on the geometry or material of each of the quantum dots and the electric field generated within the dot by the action of their adjacent control electrode potentials. Thus, for example, alignment of the energy states within the quantum dots may be accomplished by placing a non-zero potential on only one of the dots, causing alignment with the intrinsic energy states of the other quantum dots as determined by their geometries. The particular Shannon Cell implementation to be discussed employs these concepts.

Figure 4A:
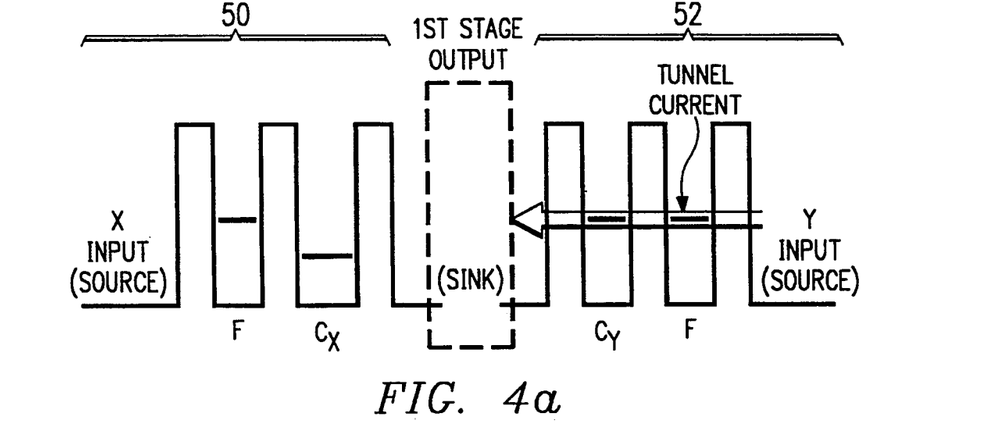
FIGS. 4a–4b illustrate energy band diagrams of a Shannon Cell constructed according to the teachings of the present invention.
Figure 4B:
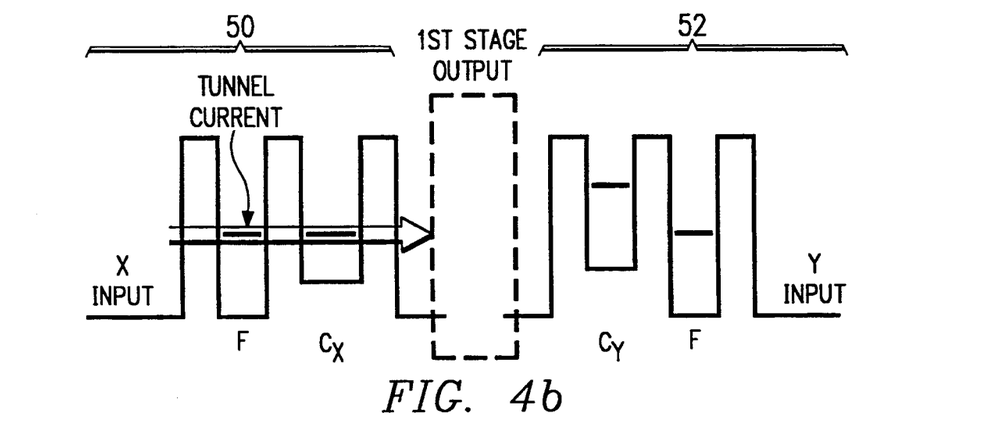

FIGS. 4a and 4b are energy band diagrams of a Shannon Cell constructed according to the teachings of the present invention. As can be seen in FIG. 4a, two quantum dot logic units 50 and 52, each having two quantum dots, are coupled together to form a Shannon Cell. In particular, the sinks of logic units 50 and 52 are coupled together. Furthermore, the source of logic unit 50 is the X input of the Shannon Cell and the source of logic unit 52 is the Y input for the Shannon Cell.

As stated above, each of the logic units 50 and 52 are comprised of two quantum dots. For each logic unit 50 and 52, the two quantum dots are characterized by a filter quantum dot (F) and a control quantum dot. The energy levels within each filter quantum dot are determined by their materials and geometry. Thus, no electric field contact is placed above this quantum dot. The control quantum dot for each logic unit has an electric field contact coupled to a control input. Thus, depending on the logic state of the control input, the energy states within the control quantum dots of the logic units 50 and 52 will be alternately aligned or misaligned with those of the filter dots.

As shown in FIG. 4a, a logic level 0, such as 0 volts, may be used to cause alignment of the electric states within the quantum dots of logic unit 52, thereby causing a resonant tunnel current between the Y input and the output. The principle of resonant tunneling is taught by Chapter 7 of Physics of Quantum Electron Devices, F. Copasso ed., Springer-Verlag, 1990, Chap. 7, pp. 181–252. FIG. 4b illustrates the alignment of the energy states within logic unit 50 by placing a logic level 1, such as −1 volts on the control input. Thus, FIGS. 4a and 4b illustrate that the output of the Shannon Cell will be equal to either the X or the Y input, depending upon the state of the control input. This is precisely the requirement of a Shannon Decomposition Function.

In a particular embodiment, as shown in FIGS. 4a and 4b, the geometrical dimensions of the filter dots for both logic units 50 and 52 is be the same. Thus, the dimensional size of the control dots for each of the logic units must be different to ensure that only one of the logic units 50 and 52 will be aligned for each of the logic states of the control input. It should be understood, however, that the filter dots of logic units 50 and 52 may be made to be of different sizes and the control dots of the same size without departing from the intended scope of the present invention. With that implementation, changing of the electric field within the control dots would change their otherwise fixed energy states into either alignment or misalignment with the energy states of the corresponding filter dots.

Alternatively, the filter and control dots can be of similar size but of different materials so that they have dissimilar energy structures, thus resulting in the same functions described above.

Figure 5A:
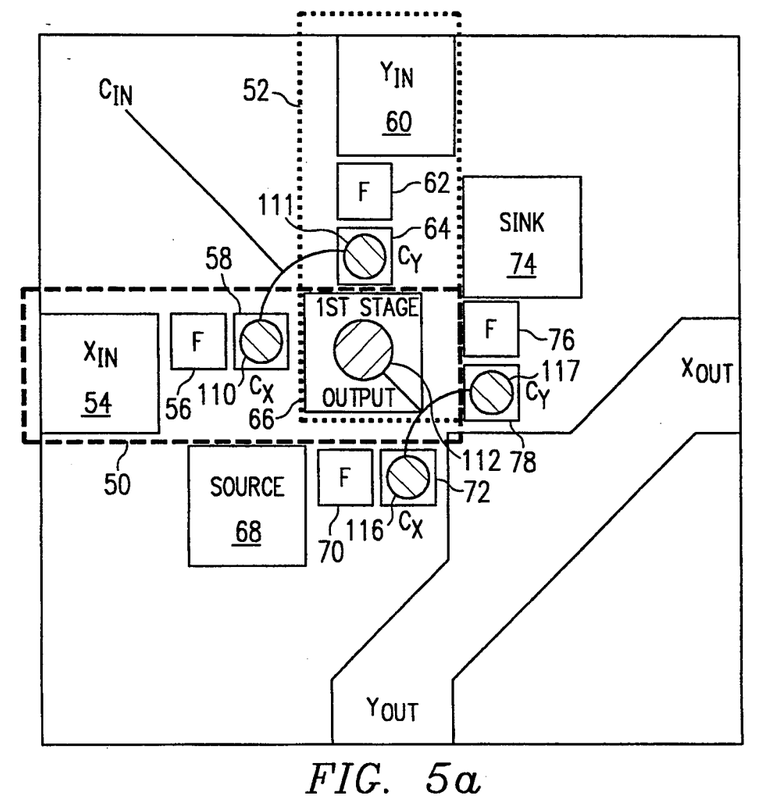
FIGS. 5a–5b are schematic top views of interconnected Shannon Cells constructed according to the teachings of the present invention.
Figure 5B:
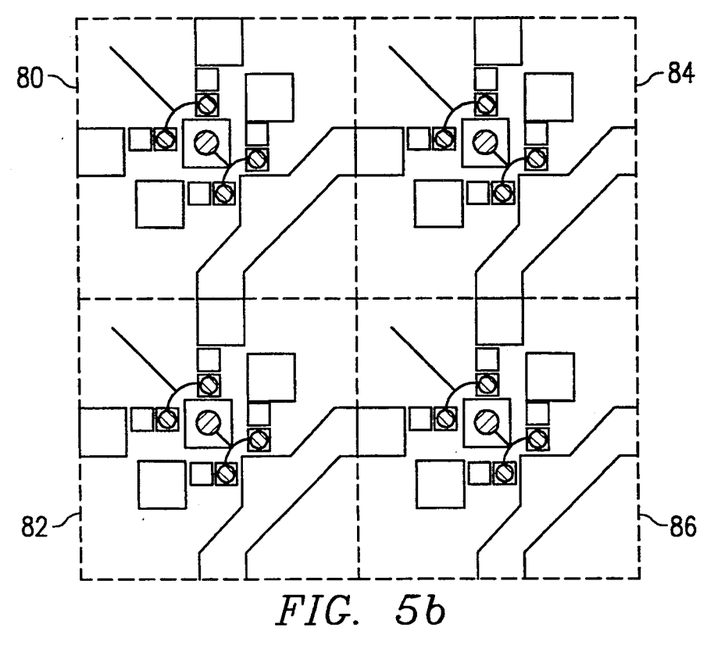

FIGS. 5a and 5b illustrate top views of a Shannon Cell, and an array of Shannon Cells, respectively, according to the present invention. As shown in FIG. 5a, quantum dot logic unit 50 comprises an X input 54, filter dot 56, and control dot 58. Likewise, quantum dot logic unit 52 comprises Y input 60, filter dot 62, and control dot 64. The output of this Shannon Cell is characterized as first stage output 66 in FIG. 5a. The control input is coupled to electric field contacts 110 and 111 disposed above control dots 58 and 64, respectively. The first stage output 66 forms the output for a Shannon Cell. However, to enhance the performance of this Shannon Cell and to allow for greater fan-in/fan-out, this first stage output 66 is used as an input to a second stage.

The second stage comprises source 68, filter dot 70, control dot 72, sink 74, filter dot 76, and control dot 78. The first stage output is coupled to the electric field contacts for control dots 72 and 78. Source 68 and sink 74 provide direct contacts to source and sink voltages, such as −1 volts and ground, respectively. Thus, the second stage is simply an output driver/buffer for insuring that true logic levels are output from the Shannon Cell. In effect, the second stage is another Shannon Cell, the purpose of which is simply to buffer the first Shannon Cell, without changing its output. If the first stage output 66 is equal to high logic level, then the output of the second stage will be equal to source 68, which is coupled to logic high. If the output of the first stage is equal to a low logic level, then the output of the second stage will be equal to sink 74, which is coupled to logic low.

FIG. 5b illustrates an array of Shannon Cells. Each of the four Shannon Cells 80, 82, 84, and 86 are constructed just as the Shannon Cell discussed in FIG. 5a. In particular, the Y output of Shannon Cell 80 is coupled to the Y input of Shannon Cell 82. Furthermore, the X output of Shannon Cell 80 is coupled to the X input of Shannon Cell 84. The Y output of Shannon Cell 84 is coupled to the Y input of Shannon Cell 86, and the X output of Shannon Cell 82 is coupled to the X input of Shannon Cell 86. Arrays such as that shown in FIG. 5b may be implemented to form complex logic functions.

Figure 6A:
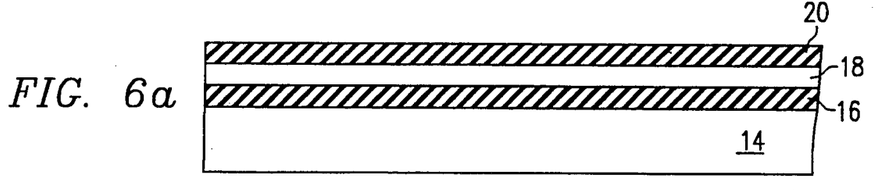
FIGS. 6a–6e illustrate the epitaxial structure and steps for constructing a Shannon Cell according to the teachings of the present invention.
Figure 6A:
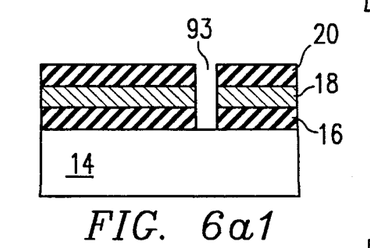
Figure 6A:
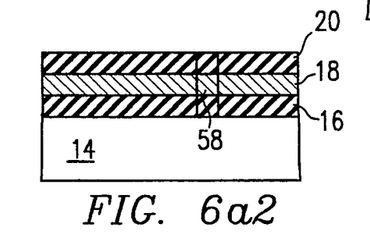
Figure 6B:
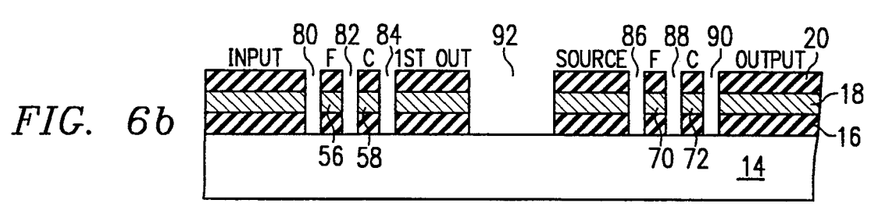

FIGS. 6a–6e illustrate representative portions of the epitaxial stack and fabrication steps used to form the Shannon Cell shown in FIG. 5a. As shown in FIG. 6a, barrier layers 16 and 20 and quantum layer 18 are formed over substrate layer 14. As shown in FIG. 6b, trenches 80, 82, 84, 86, 88, and 90 are etched through barrier layers 16 and 20 and quantum layer 18. Furthermore, isolation region 92 is also etched through to the substrate layer 14. Trenches 80 through 90 and isolation region 92 may be etched with the techniques discussed in connection with FIGS. 2a–2c or with reactive ion etching or with ion beam assisted etching, because of the anisotropic qualities of these known etching techniques.

For the embodiment in which the quantum dots are of different sizes, the sizes may be altered in several ways. For example, the trenches 80–90 can be spaced apart at varying spacings so as to form different sized quantum dots, such as dots 56, 58, 70, and 72, as required. As another example, the depth (into the paper) of the quantum dots can be varied so as to form different sized quantum dots.

FIGS. 6a1–6a2 illustrate certain fabrication steps for the embodiment in which different materials are used for the quantum dots. As shown in FIG. 6a1, a trench 93 is attached through barrier layer 20 and quantum layer 18. FIG. 6a2 illustrates regrowth of quantum dot 58 and barrier refill 95. For example, quantum dot 58 may be regrown, with the techniques described above, with InAlGaAs for a quantum layer 18 of InGaAs or GaAs. With the steps shown in FIGS. 6a1 and 6a2, the materials of each quantum dot may be varied. The steps described in connection with FIG. 6b apply as well to the different materials embodiment of FIGS. 6a1 and 6a2.

Figure 6C:
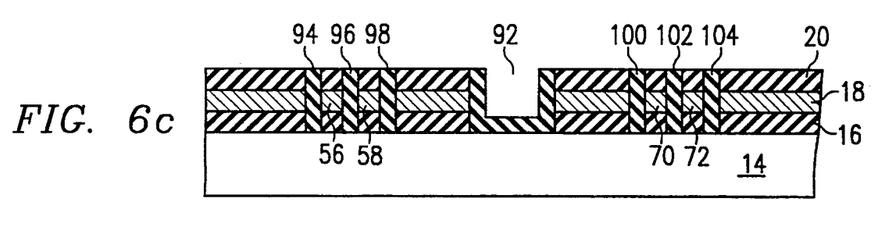
Figure 6D:
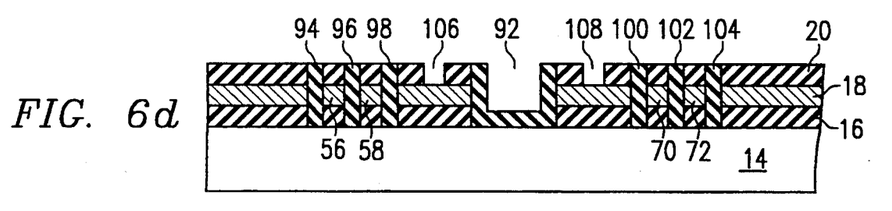
Figure 6E:
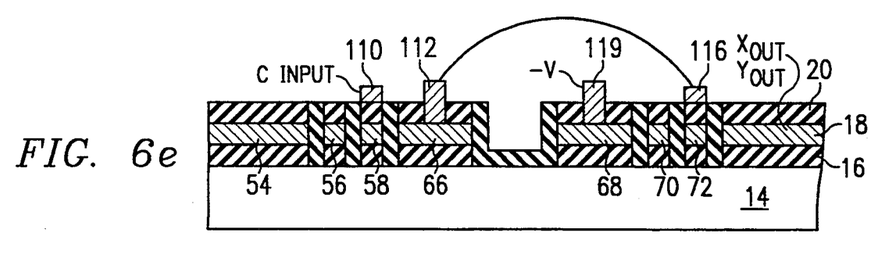

The following discussion of FIGS. 6c–6e applies to both the different geometry and different materials embodiments. FIG. 6c illustrates the regrowth of high bandgap materials within trenches 80 through 90 and over the surface of isolation region 92. As discussed above, this regrowth may be performed using molecular beam epitaxy or MOCVD. These regrown areas form horizontal tunnel barriers 94, 96, 98, 100, 102 and 104. These horizontal tunnel barriers are in the range of tens of angstroms wide to approximately 100 angstroms wide. Furthermore, the thickness of the quantum well layer 18 is on the order of 100 angstroms, and the distance between the horizontal barriers, or the horizontal size of the quantum dots, is also on the order of 100 angstroms. The thickness of the barrier layers 16 and 20 is on the order of 200–300 angstroms, which is thick enough to prevent tunneling through these barrier layers. The barrier layers should be formed of materials with a high enough bandgap to prevent tunneling through them. Thus, they could be insulators or semiconductors with high enough bandgaps.

FIG. 6d illustrates the etching of trenches 106 and 108 to allow for contacting to quantum well layer 18. It should be understood, however, that an alloyed contact could be spiked through barrier layer 20 to contact with quantum layer 18.

As shown by the connection scheme shown in FIG. 6e, FIGS. 6a–6e illustrate the fabrication steps and epitaxial stack for quantum dot logic unit 50 of the first stage of FIG. 5a and the quantum dot logic unit comprised of source 68, filter dot 70, and control dot 72 of the second stage of FIG. 5a. The other elements of FIG. 5a are fabricated according to the same steps as shown in FIGS. 6a–6e.

Contact 110 shown in FIG. 6e is the electric field contact over control dot 58. Furthermore, contact 112 is the output contact for first stage output 66. This contact 112 is coupled to contact 116, which is the control contact for control dot 72 of the second stage of FIG. 5a. Contact 114 is the contact for source 68. As shown in FIG. 5a, the control input to the Shannon Cell, in addition to being coupled to contact 110, is also coupled to contact 111 of control dot 64. Finally, as shown in FIG. 5a, the first stage output 66, in addition to being coupled to contact 116, is coupled to contact 117 of control dot 78.

The metal contacts 110 and 116 over the control dots as well as those over the other control dots of FIG. 5a, are preferably schottky contacts and all other contacts are preferably ohmic.

Figure 7A:
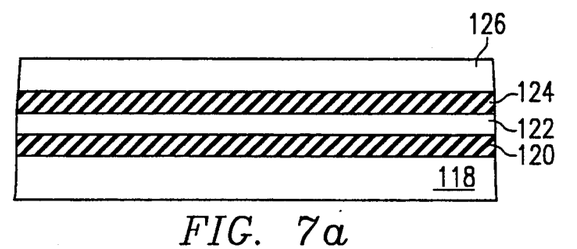
FIGS. 7a–7c illustrate the epitaxial stack for a Shannon Cell constructed according to another embodiment of the present invention.
Figure 7B:
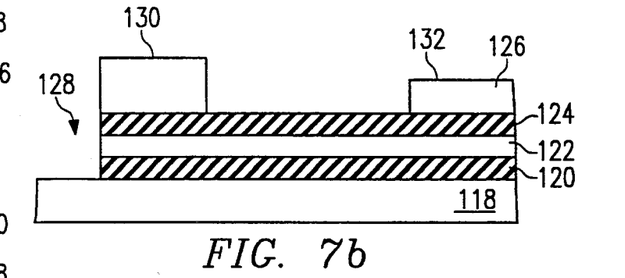
Figure 7C:
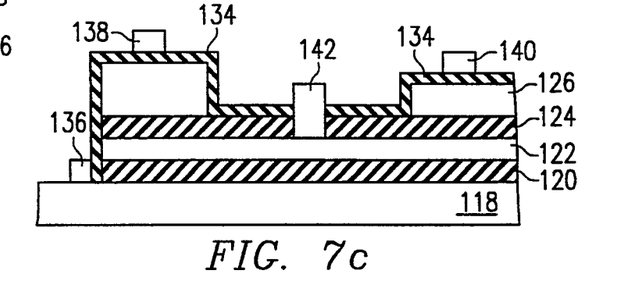

FIGS. 7a–7c illustrate an alternate embodiment of a Shannon Cell constructed according to the teachings of the present invention that makes use of vertical tunnel barriers. FIG. 7a illustrates that a substrate layer 118 is provided over which a barrier layer 120, a quantum layer 122, another barrier layer 124, and another quantum layer 126 are grown. FIG. 7b illustrates that a portion of layers 126, 124, 122, and 120 are etched through to substrate layer 118 to form contact opening 128.

Furthermore, quantum layer 126 is etched to form X-well 130 and Y-well 132, as shown in FIG. 7b. Y-well 132 is more heavily etched than X-well 130 such that the thickness of Y-well 132 is less than that of X-well 130. As shown in FIG. 7c, insulator layer 134 is grown over contact opening 128, X-well 130, Y-well 132, and the exposed surface of barrier layer 124 between X-well 130 and Y-well 132. A control contact 136 is then contacted to substrate layer 118 at the base of the contact opening 128. Furthermore, contact 138 is placed over the insulator layer 134 over X-well 130, and contact 140 is placed over the insulator 134 over Y-well 132. Output contact 142 is contacted through insulator layer 134 and barrier layer 124 to quantum layer 122.

As shown above, FIGS. 7a–7c illustrate an embodiment that makes use of vertical tunneling barriers, as opposed to the lateral tunneling barriers illustrated in connection with FIGS. 2a–6e. The material growing and etching techniques used in FIGS. 7a–7c may be the same as those discussed above in connection with FIGS. 6a–6e and FIGS. 2a–2c.

Figure 8A:
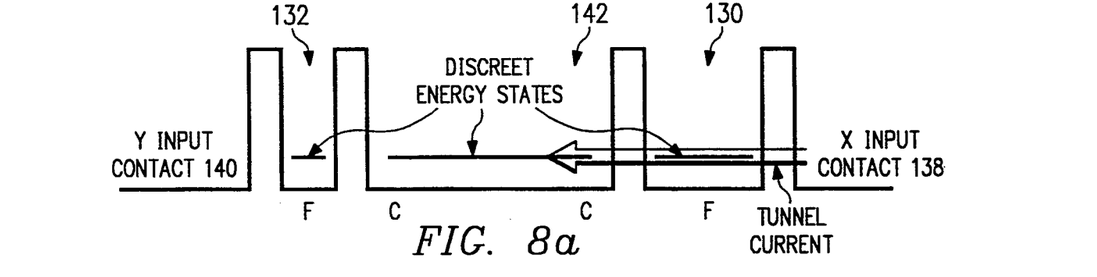
FIGS. 8a and 8b are energy band diagrams of the device illustrated in FIGS. 7a–7c.
Figure 8B:
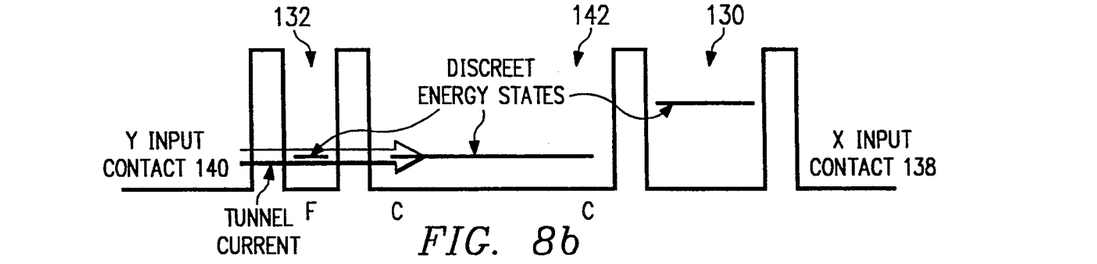

The operation of the Shannon Cell illustrated in FIGS. 7a–7c is best understood with reference to the energy band diagrams of FIGS. 8a and 8b. As shown in FIG. 8a, tunneling current will flow from the X input contact 138 to contact 142 through X-well 130 and quantum well 122 if the energy state of X-well 130 aligns with those of quantum layer 122. The energy states within quantum layer 122 are controlled by the potential placed on control contact 136, and thus quantum layer 122 is a control well. Furthermore, X-well 130 acts as a filter quantum dot. By changing its size, electrons can be made to tunnel through it only when the control input causes alignment of the energy states within X-well 130 with those of quantum layer 122. Alternatively, X-well 130 and Y-well 132 could be of similar size but formed of different materials, resulting in different energy structures, to accomplish the same function.

Likewise, FIG. 8b illustrates current tunneling from Y input contact 140 to output contact 142 through Y-well 132 and quantum well 122. Since Y-well 132 is of a different thickness than X-well 130, it will have different energy states than X-well 130. Consequently, electrons will tunnel through Y-well 132 for different energy states within quantum layer 122 than those that cause tunneling through X-well 130.

Although the present invention has been described in detail, it should be understood that various changes, substitutions and alterations can be made without departing from the spirit and scope of the invention as defined solely by the appended claims.

What is claimed is:

1. A method of fabricating a quantum-effect implementation of Shannon Cell, comprising the steps of:
    providing a semiconductor substrate;
    forming a first barrier layer overlying the substrate;
    forming a quantum layer overlying the first barrier layer;
    forming a second barrier layer overlying the quantum layer;
    etching through said first and second barrier layers and said quantum layer to separate a first quantum dot logic unit area from a second quantum dot logic unit area;
    etching three trenches in the first quantum dot logic unit area to define a first filter quantum dot and a first control quantum dot;
    etching three trenches in the second quantum dot logic unit area to define a second filter quantum dot and a second control quantum dot;
    regrowing heterojunction tunnel barriers in the trenches;
    forming an X-input contact conductively coupled to the quantum well in the first quantum dot logic unit area;
    forming a first control contact insulatively adjacent the first control quantum dot, such that potentials placed on the first control contact align or misalign electron energy states within the first control quantum dot with electron energy states of the first filter quantum dot;
    forming a first output contact conductively coupled to the quantum well opposite the first filter quantum dot and the first control quantum dot from the X-input contact;
    forming a Y-input contact conductively coupled to the quantum well in the second quantum dot logic unit area;
    forming a second control contact insulatively adjacent the second control quantum dot and coupled to the first control contact, such that potentials placed on the second control contact align or misalign electron energy states within the second control quantum dot with electron energy states of the second filter quantum dot; and
    forming a second output contact conductively coupled to the quantum well opposite the second filter quantum dot and the second control quantum dot from the Y-input contact, the second output contact coupled to said first output contact.

2. The method of claim 1, and further comprising the steps of:
    etching through said first and second barrier layers and said quantum layer to define a third quantum dot logic unit area and fourth quantum dot logic unit area;
    etching three trenches in the third quantum dot logic unit area to define a third filter quantum dot and a third control quantum dot;
    etching three trenches in the fourth quantum dot logic unit area to define a fourth filter quantum dot and a fourth control quantum dot;
    regrowing heterojunction tunnel barriers in the trenches;
    forming a source contact conductively coupled to the quantum well in the third quantum dot logic unit area;
    forming a third control contact insulatively adjacent the third control quantum dot and coupled to the first and second output contacts, such that potentials placed on the first control contact align or misalign electron energy states within the third control quantum dot with electron energy states of the third filter quantum dot;
    forming a first buffer output contact conductively coupled to the quantum well opposite the third filter quantum dot and the third control quantum dot from the source contact;

forming a sink contact conductively coupled to the quantum well in the fourth quantum dot logic unit area;

forming a fourth control contact insulatively adjacent the fourth control quantum dot and coupled to the third control contact, such that potentials placed on the fourth control contact align or misalign electron energy states within the fourth control quantum dot with electron energy states of the fourth filter quantum dot; and forming a second buffer output contact conductively coupled to the quantum well opposite the fourth filter quantum dot and the fourth control quantum dot from the sink contact, the second buffer output contact coupled to the first buffer output contact.

3. A method of fabricating a quantum-effect implementation of Shannon Cell, comprising the steps of:

providing a semiconductor substrate;

forming a first barrier layer overlying the substrate;

forming a first quantum layer overlying the first barrier layer;

forming a second barrier layer overlying the first quantum layer;

forming a second quantum layer overlying the second barrier layer;

etching a contact opening through the first and second barrier layers and the first and second quantum layers to the semiconductor substrate;

etching the second quantum layer to define an X-well and a Y-well, the X-well and Y-well having different thicknesses and spaced apart by etching through to the second barrier layer between the X-well and Y-well;

forming an insulating layer overlying the X-well, the Y-well, the contact opening, and the space between the X-well and Y-well;

forming a control contact conductively coupled to the semiconductor substrate at the contact opening;

forming an X-input contact insulatively adjacent to the X-well;

forming a Y-input contact insulatively adjacent to the Y-well; and forming an output contact conductively coupled to the first quantum layer, such that potentials placed on the control contact affect electron energy states within the first quantum layer, thereby causing alignment or misalignment with the energy states within the X-well and Y-well, such that current flows either from the X-input contact or the Y-input contact to the output contact.

* * * * *